US006469245B2

(12) United States Patent
Son

(10) Patent No.: US 6,469,245 B2
(45) Date of Patent: Oct. 22, 2002

(54) ELECTROMAGNETIC WAVE ATTENUATOR FOR MOBILE COMMUNICATION TERMINAL

(75) Inventor: Taeho Son, Asan (KR)

(73) Assignee: Nissi Telecom Co., Ltd. (KR)

( * ) Notice: Subject to any disclaimer, the term of this patent is extended or adjusted under 35 U.S.C. 154(b) by 0 days.

(21) Appl. No.: 09/735,620

(22) Filed: Dec. 14, 2000

(65) Prior Publication Data

US 2001/0047875 A1 Dec. 6, 2001

(30) Foreign Application Priority Data

Apr. 19, 2000 (KR) ........................................... 00-20660

(51) Int. Cl.[7] ................................................ H05K 9/00

(52) U.S. Cl. .............................. 174/35 MS; 174/35 R; 455/117

(58) Field of Search .......................... 174/35 MS, 35 R, 174/35 GC; 361/799, 800, 816, 818; 455/90, 117; 343/841

(56) References Cited

U.S. PATENT DOCUMENTS 4,164,718 A * 8/1979 Iwasaki ..................... 333/81 R
4,977,296 A * 12/1990 Hemming .............. 174/35 MS
5,160,806 A * 11/1992 Harada et al. ......... 174/35 GC
6,099,969 A * 8/2000 Ogata ......................... 106/436

FOREIGN PATENT DOCUMENTS

JP 02253699 A * 10/1990 ............ H05K/9/00

* cited by examiner

*Primary Examiner*—Dean A. Reichard
*Assistant Examiner*—Carmelo Oliva
(74) *Attorney, Agent, or Firm*—Burns, Doane, Swecker & Mathis, LLP

(57) ABSTRACT

An electromagnetic wave attenuator for a mobile communication terminal is provided. The electromagnetic wave attenuator for a mobile communication terminal includes a corrugate structure conductor having a plurality of ridges plurality of ridges between which slots are formed, and a highly dielectric material having a relative dielectric constant of more than 50 filled in the slots.

19 Claims, 4 Drawing Sheets

ELECTROMAGNETIC WAVE ATTENUATOR FOR MOBILE COMMUNICATION TERMINAL

This application claims priority under 35 U.S.C. § 119 and/or 365 to 00-20660 filed in Republic of Korea on Apr. 20, 2000; the entire contents of which is hereby incorporated by reference.

BACKGROUND OF THE INVENTION

1. Field of the Invention

The present invention relates to an electromagnetic wave attenuator for attenuating a strong electromagnetic wave which is emitted from a mobile communication terminal and which may be harmful to the human body.

2. Description of the Related Art

Since it is possible to transmit information via mobile communication terminals anywhere and anytime, the use of mobile communication terminals is increasing, and more particularly, the use of a mobile phone which is a kind of mobile communication terminal, is rapidly increasing. Furthermore, the appearance of international mobile telecommunications-2000 (IMT-2000), which is expected to be on the market at the beginning of the year 2000, enables the use of mobile communication terminals to be more widespread.

Mobile phones, among mobile communication terminals, are classified into cellular phones having a transmitting frequency range of 824~849 MHz and personal communication service (PCS) phones having a transmitting frequency range of 1750~1780 MHz.

The frequency of cellular phones used in the U.S.A. is the same as that of cellular phones used in Korea. However, in the case of PCS phones, a frequency range of 1850~1910 MHz, which is about 100 MHz higher than that of PCS phones used in Korea, is used in the U.S.A. Furthermore, a transmitting frequency of 880~915 MHz of a global system for mobile communication (GSM) is used in Europe where it occupies more than 60% of a mobile phone market. Also, a codeless telephone for home use is classified into CTI having a frequency of 914 MHz and CTI+ having a frequency of 885 MHz. A helical antenna and ¼ wavelength earth antenna, which is a wire antenna, are used for an antenna for a mobile phone.

However, when a mobile communication terminal such as a mobile phone is used, a signal amplified by a high frequency circuit in the mobile phone changes into an electromagnetic wave via an antenna, here, the electromagnetic wave may have a harmful effect on the human body which is adjacent to the mobile phone, particularly, to brain tissue. That is, the strong electromagnetic wave penetrates directly into the brain of the human body, interacts with electrons and nuclei of atoms forming the brain tissue by the effects of polarization, and may transform protein of the brain tissue. As a result, parts of normal brain tissue may become abnormal. Also, it is reported that strong electromagnetic waves, like some poisonous chemical materials, may give rise to cancer.

SUMMARY OF THE INVENTION

To solve the above problem, it is an object of the present invention to provide an electromagnetic wave attenuator for a mobile communication terminal which is capable of attenuating a strong electromagnetic wave originating from the mobile communication terminal and minimizing damage due to the electromagnetic wave.

Accordingly, to achieve the above object, there is provided an electromagnetic wave attenuator for a mobile communication terminal. The electromagnetic wave attenuator for a mobile communication terminal includes a corrugate structure conductor having a plurality of ridges between which slots are formed, and a highly dielectric material having a relative dielectric constant of more than 50 filled in the slots.

The number of the ridges is 3~8 per wavelength of a center frequency in air, and the ratio of the width of the ridges to the width of the slot is less than 0.6, and the depth of the slot is ¼ wavelength of the center frequency in air.

The highly dielectric material can be $SrTiO_3$ having a relative dielectric constant between 270 and 290, or $0.95SrTiO_3+0.05ZnTiO_3$ having a relative dielectric constant between 240 and 260.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
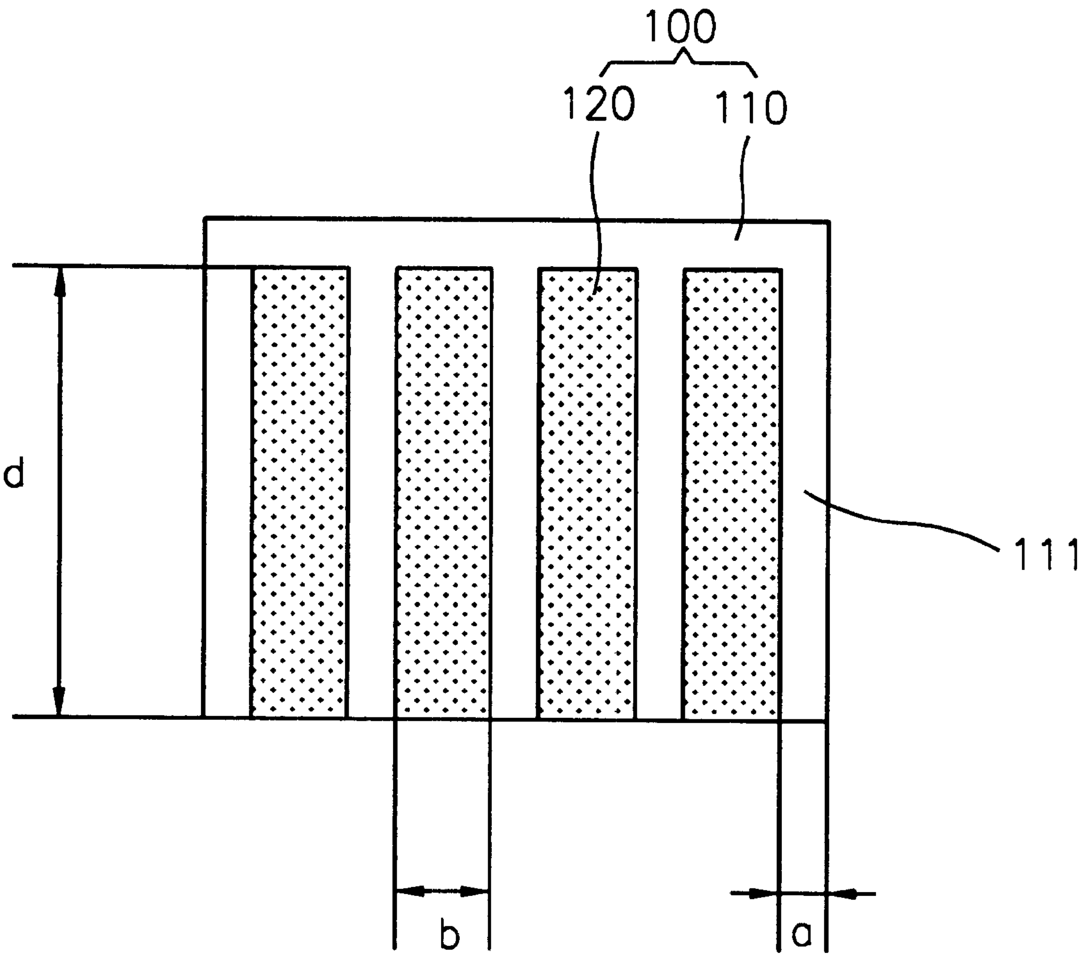
FIG. 1 is a internal sectional view of an electromagnetic wave attenuator for a mobile communication terminal according to the present invention.

Referring to FIG. 1, an electromagnetic wave attenuator 100 according to the present invention includes a corrugate structure conductor 110 having a plurality of ridges 111 between which slots are formed, and a highly dielectric material 120 having a relative dielectric constant of more than 50 filled in the slots.

The corrugate structure conductor 110 attenuates a high electric field component of an electromagnetic wave propagating a surface of the corrugate structure conductor 110. Here, the number of the ridges 111 is 3~8 per wavelength of a center frequency in air. That is, for example, in the case of a personal communication service (PCS) having a frequency range of 1750~1780 MHz, the center frequency is 1765 MHz, and the wavelength of the center frequency in air is about 17 cm. Thus, there are 3~8 ridges in a 17 cm span. However, substantially, the greater number of ridges 111, the greater the attenuation. That is, the number of ridges 111 is limited to the above range and the entire size of the electromagnetic wave attenuator is reduced by using a highly dielectric material to be described later. Here, the material of the corrugate structure conductor 110 can be formed of metal such as silver (Ag), aluminum (Al), or copper (Cu).

The ratio of the width a of the ridges 111 to the width b of the slots is less than 0.6, and the less, the better. In a preferred embodiment of the present invention, the ratio of the width a of the ridges to the width b of the slots is 0.02. The depth d of the slot is ¼ wavelength of the center frequency in air.

In this way, the size, width, and depth of the slot and the ridges 111 are important variables. In the above structure, a complicated equation for applying a mode matching theory is necessary for interpretation of attenuation, and the equation will be omitted.

A highly dielectric material 120 reduces the size of the attenuator 100. That is, the size of the corrugate structure conductor 110 is inversely proportional to the square root of the relative dielectric constant, and the entire size of the attenuator 100 is reduced by employing the highly dielectric material 120 having a large relative dielectric constant.

Preferably, the material to be used as the highly dielectric material 120, as described above, is a ceramic compound dielectric material having a relative dielectric constant of more than 50. In the preferred embodiment, the highly dielectric material 120 is $SrTiO_3$ having a relative dielectric constant between 270 and 290, preferably, 280, or $0.95SrTiO_3+0.05ZnTiO_3$ having a relative dielectric constant between 240 and 260, preferably, 250. Here, the electromagnetic wave attenuator of which the highly dielectric material is $SrTiO_3$ can be used for an analog or digital cellular phone, a terminal for a global system for mobile communication (GSM), a phone of 900 MHz for home use, a CT phone, a domestic PCS, or a foreign DCS1800. An attenuator for a mobile phone of which highly dielectric material is $0.95SrTiO_3+0.05ZnTiO_3$ can be used for a PCS for use in the U.S.A., a digital enhanced cordless telecommunication (DECT), and a PHS for use in Japan. The electromagnetic wave attenuator can also be used for an international mobile telecommunications-2000 (IMT-2000) by changing the number of ridges or the relative dielectric constant of the highly dielectric material.

Figure 2:
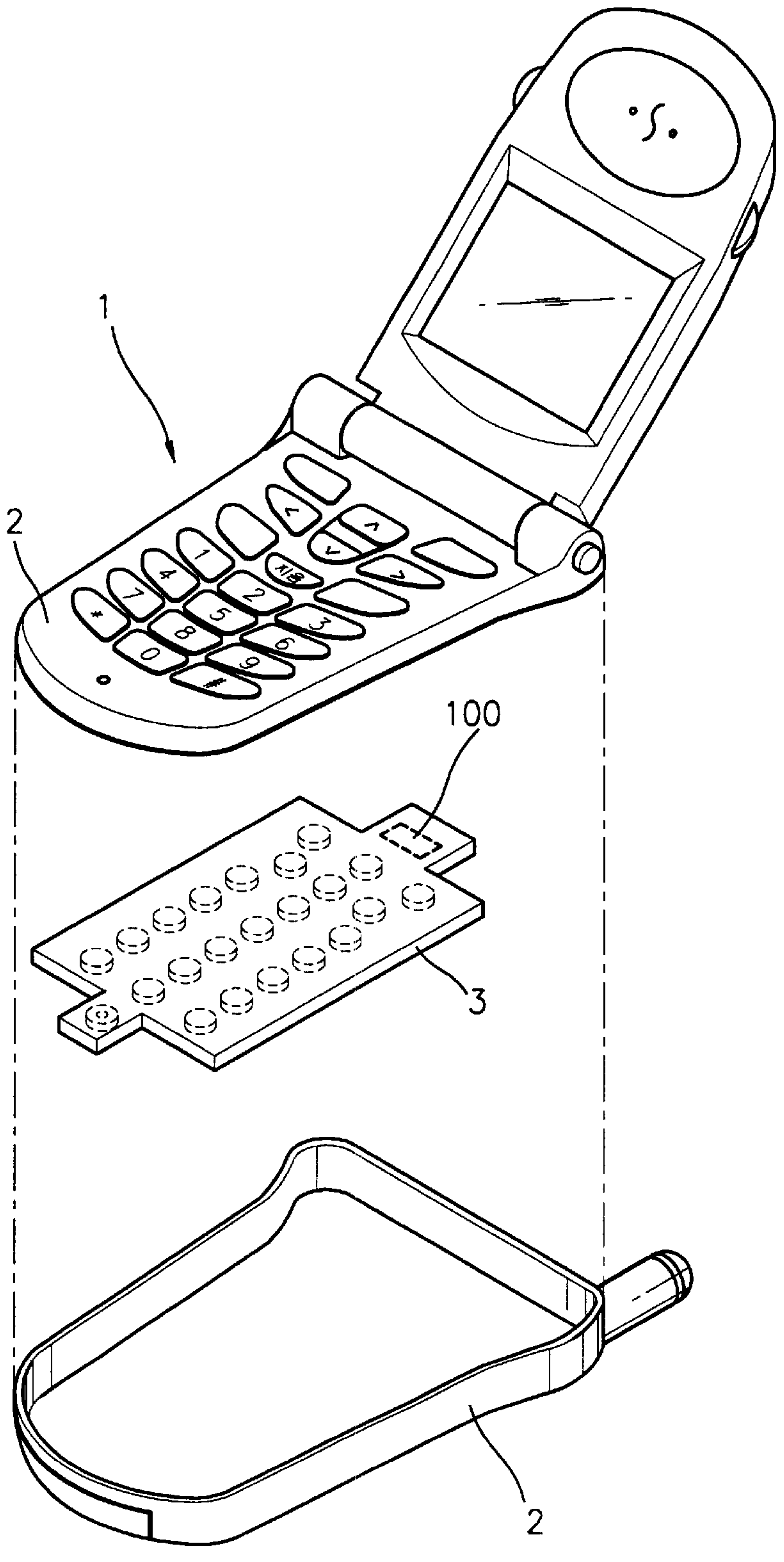
FIG. 2 is a perspective view in which the electromagnetic wave attenuator for a mobile communication terminal of the present invention is attached to a printed circuit board (PCB) of a mobile phone.
Figure 3:
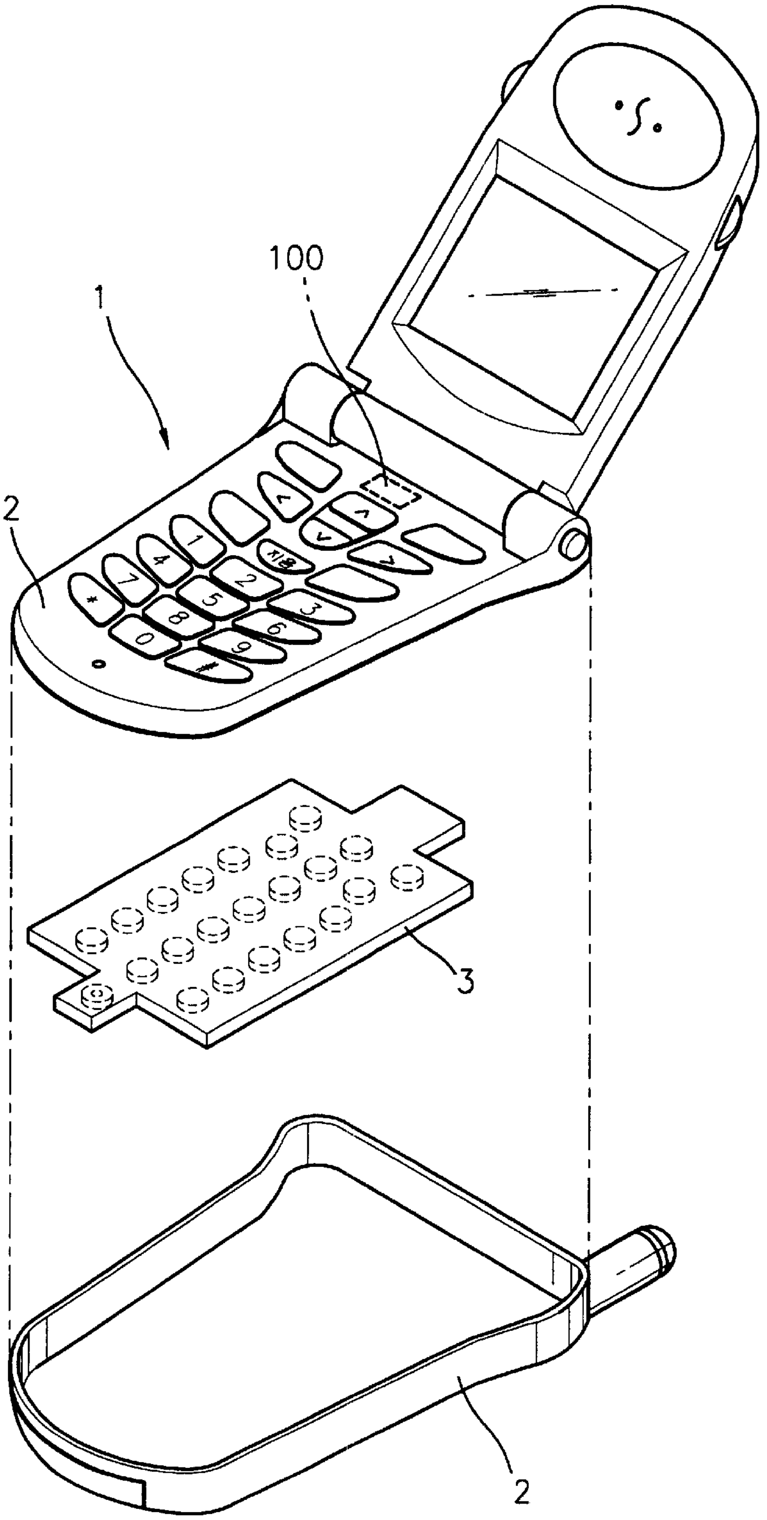
FIG. 3 is a perspective view in which the electromagnetic wave attenuator for a mobile communication terminal of the present invention is attached to an internal side of a mobile phone case.

The attenuator 100 is installed either on a printed circuit board (PCB) 3 in a mobile phone 1 as shown in FIG. 2 or at an internal side of a mobile phone case 2 as shown in FIG. 3. That is, either one side of the corrugate structure conductor 110 is soldered with a predetermined conductor which is exposed to the PCB 3, or one side of the corrugate structure conductor 110 is installed at the internal side of the mobile phone case 2 by adhesives (not shown), thereby the attenuator 100 is installed in the mobile phone 1.

Here, the attenuator 100 is installed at a position of the maximum SAR value by measurement of a specific absorption rate (SAR) of the human body. The SAR value is measured by a specific widely used measuring method.

The SAR is a unit for indicating the penetration of the electromagnetic wave received by the human body and is obtained by Equation 1.

$$SAR = \frac{\sigma \cdot |E|^2}{\rho}[W/Kg] \qquad \text{[Equation 1]}$$

Here, σ is the conductivity of the human body, E is the strength of the electric field penetrating into the human body, and ρ is mass density of the human body. Accordingly, the larger the electric field penetrating into the human body is and the higher the conductivity of the human body is, and the lower the mass density of the human body is, the larger SAR value is.

Thus, the attenuator 100 is installed at a position of the maximum SAR value in the mobile phone 1, thereby the electromagnetic wave transmitted into the human body or the brain can be effectively intercepted.

Figure 4:
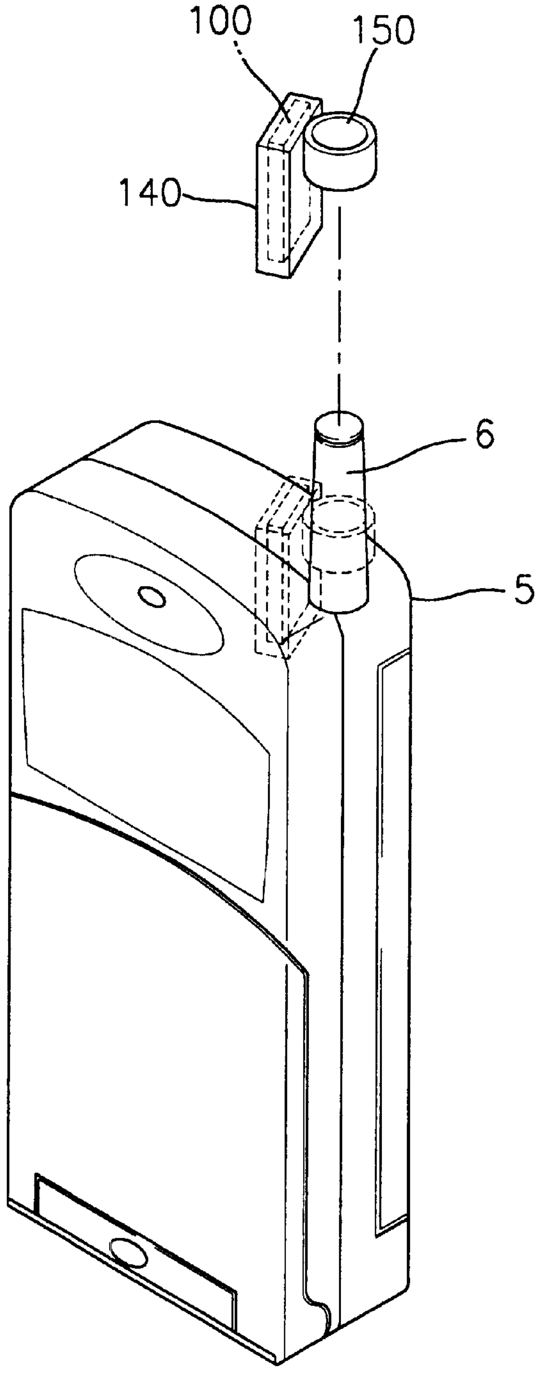
FIG. 4 is a perspective view in which the electromagnetic wave attenuator for a mobile communication terminal of the present invention is installed in an antenna of a mobile phone.

Meanwhile, as shown in FIG. 4, the attenuator 100 is received in a case 140, and then, the attenuator 100 is fixed to an antenna 6 of a mobile phone 5 by a holder 150 installed at one side of the case 140. The electromagnetic wave attenuator is installed outside of the mobile phone by employing the holder 150, and in this case, the electromagnetic wave attenuator can be used for a conventional mobile phone.

As described above, the electromagnetic wave attenuator for a mobile communication terminal according to the present invention can attenuate a strong electromagnetic wave originating from a mobile phone, thereby protecting the human body from the electromagnetic wave and enabling free communication.

What is claimed is:

1. An electromagnetic wave attenuator for a mobile communication terminal comprising:

a corrugate structure conductor having a plurality of ridges between which slots are formed; and a highly dielectric material having a relative dielectric constant of more than 50 filled in the slots.

2. The electromagnetic wave attenuator for a mobile communication terminal according to claim 1, wherein the number of the ridges is 3~8 per wavelength of a center frequency in air.

3. The electromagnetic wave attenuator for a mobile communication terminal according to claim 1, wherein the ratio of the width of the ridges to the width of the slots is less than 0.6.

4. The electromagnetic wave attenuator for a mobile communication terminal according to claim 1, wherein the depth of the slots is ¼ wavelength of a center frequency in air.

5. The electromagnetic wave attenuator for a mobile communication terminal according to claim 1, wherein the corrugate structure conductor is formed of one of silver (Ag), aluminum (Al), and copper (Cu).

6. The electromagnetic wave attenuator for a mobile communication terminal according to claim 1, wherein the highly dielectric material is a ceramic compound dielectric material.

7. The electromagnetic wave attenuator for a mobile communication terminal according to claim 1, wherein the highly dielectric material is $SrTiO_3$ having a relative dielectric constant between 270 and 290.

8. The electromagnetic wave attenuator for a mobile communication terminal according to claim 1, wherein the highly dielectric material is $0.95SrTiO_3+0.05ZnTiO_3$ having a relative dielectric constant between 240 and 260.

9. The electromagnetic wave attenuator for a mobile communication terminal according to claim 1, further comprising a predetermined conductor soldered to one side of the corrugate structure conductor.

10. The electromagnetic wave attenuator for a mobile communication terminal according to claim 1, further comprising an adhesive on one side of the corrugate structure conductor.

11. The electromagnetic wave attenuator for a mobile communication terminal according to claim 1, further comprising:

a case in which the attenuator is installed; and a holder on a side of the case that attaches the case to an antenna of a mobile phone.

12. The electromagnetic wave attenuator for a mobile communication terminal according to claim 1, wherein the attenuator is installed at a position of maximum specific absorption rate value on a mobile phone.

13. A mobile communication terminal comprising:

a source of electromagnetic waves; and an electromagnetic wave attenuator positioned adjacent to said source of electromagnetic waves, said electromagnetic wave attenuator including:

a corrugate structure conductor having a plurality of ridges between which slots are formed; and a highly dielectric material having a relative dielectric constant of more than 50 filled in the slots.

14. The mobile communication terminal according to claim 13, wherein the number of ridges is 3~8 per wavelength of a center frequency in air.

15. The mobile communication terminal according to claim 13, wherein the ratio of the width of the ridges to the width of the slots is less than 0.6.

16. The mobile communication terminal according to claim 13, wherein the depth of the slots is ¼ wavelength of a center frequency in air.

17. The mobile communication terminal according to claim 13, wherein the highly dielectric material is a ceramic compound dielectric material.

18. The mobile communication terminal according to claim 13, wherein the highly dielectric material is $SrTiO_3$ having a relative dielectric constant between 270 and 290.

19. The mobile communication terminal according to claim 13, wherein the highly dielectric material is $0.95SrTiO_3 + 0.05ZnTiO_3$ having a relative dielectric constant between 240 and 260.

* * * * *